United States Patent [19]

Craiglow

[11] Patent Number: 4,896,155
[45] Date of Patent: Jan. 23, 1990

[54] METHOD AND APPARATUS FOR SELF-CALIBRATION OF SUBRANGING A/D CONVERTER

[75] Inventor: Robert L. Craiglow, Cedar Rapids, Iowa

[73] Assignee: Rockwell International Corporation, El Segundo, Calif.

[21] Appl. No.: 210,046

[22] Filed: Jun. 22, 1988

[51] Int. Cl.[4] .............................................. H03M 1/10
[52] U.S. Cl. .................................... 341/120; 341/156; 341/159
[58] Field of Search ............... 341/118, 120, 122, 155, 341/159, 162, 163

[56] References Cited

U.S. PATENT DOCUMENTS

| | | | |
|---|---|---|---|
| 4,222,107 | 9/1980 | Mrozowski et al. | 364/571 |
| 4,227,183 | 10/1980 | Ninomiya | 340/347 |
| 4,272,760 | 6/1981 | Prazak et al. | 340/347 |
| 4,340,882 | 7/1982 | Maio et al. | 340/347 |
| 4,410,876 | 10/1983 | Sawagata | 340/347 |
| 4,573,035 | 2/1986 | Dolazza | 340/347 |
| 4,612,533 | 9/1986 | Evans | 340/347 |
| 4,644,324 | 2/1987 | Araki et al. | 340/347 |
| 4,700,173 | 10/1987 | Araki | 340/347 |

OTHER PUBLICATIONS

Lee, et al., "A Self-Calibrating 15 Bit CMOS A/D Converter," IEEE Journal of Solid-State Circuits, vol. SC-19, No. 6, Dec. 1984.
Analog Devices Brochure, MOD-1205, 12-Bit Video Analog-to-Digital Converter (Undated).
"Digital Sonobuoy Receiver, Design Definition Task Report," Contract N62269-84-C-0032, Data Item 'A002, Jun. 11, 1985.
"HF Signal Acquisition system Technology Investigation, Narrowband System Analysis Report," Contract N00039-85-C-0075, Data Item 0001, Oct. 30, 1985.

Primary Examiner—William M. Shoop, Jr.
Assistant Examiner—Helen Kim
Attorney, Agent, or Firm—J. C. McFarren; J. J. Horn; H. Fredrick Hamann

[57] ABSTRACT

A subranging analog-to-digital (A/D) converter is provided with a calibration mode for linearity correction. In the calibration mode, an up/down calibration counter provides a digital input to a calibration logic circuit and to an estimator digital-to-analog (D/A) converter. The analog output of the estimator D/A converter is provided as an inverted input to a residue operational amplifier, and is combined with a dither noise signal for input to a sample-and-hold circuit. The output of the sample-and-hold circuit is provided to a noninverting input of the residue operational amplifier. The operational amplifier provides an analog residue signal to a residue A/D converter that generates a digital residue signal for input to the calibration logic circuit. The calibration logic circuit calculates and stores a linearity correction table based on the average step size computed from the inputs to the calibration logic circuit for each step of the up/down counter. The stored correction table is used to provide linearity correction for the subranging A/D converter when it is operating in the run mode.

12 Claims, 2 Drawing Sheets

4,896,155

METHOD AND APPARATUS FOR SELF-CALIBRATION OF SUBRANGING A/D CONVERTER

TECHNICAL FIELD

The present invention relates to analog-to-digital converts and, in particular, to a method and apparatus for self-calibration of a subranging, A/D converter for linearity correction.

BACKGROUND OF THE INVENTION

Multiple stage analog-to-digital (A/D) converters are a cross between successive approximation converters and flash A/D converters wherein multiple flash A/D converters and one or more digital-to-analog (D/A)/ converters are used to achieve the conversion. For example, two-stage, or subranging, A/D converters use a first stage estimator A/D converter to make a rough estimate of the size of the analog input signal. The digital output of the estimator A/D converter drives an estimator D/A converter. The analog output of the estimator D/A converter is subtracted from the analog input signal to provide a residue voltage having a smaller amplitude. The residue voltage is amplified and applied to a second stage residue A/D converter that provides a digital output representing the analog residue voltage. The digital output of the residue A/D converter is added to the digital output of the estimator A/D converter along with the proper bit shift to account for the gain of the residue voltage amplifier. This two-stage conversion process provides increased resolution.

The accuracy of a subranging A/D converter is limited primarily by the linearity of the estimator D/A converter and the accuracy of the residue amplifier gain. The estimator D/A converter analog output voltage must represent its digital input accurately because it is necessary to know digitally how much analog voltage is being subtracted from the analog input signal. Similarly, the gain of the residue amplifier and residue A/D converter must be known relative to the output of the estimator D/A converter.

Actual performance of A/D converters is degraded from the theoretical ideal by such factors as D/A and A/D converter nonlinearities, residue amplifier gain error, aperture jitter, timing errors, nonlinear input impedances, amplifier noise, sample-and-hold settling time, digital noise pickup, and code errors due to metastable flip-flops states. All but the first two of these sources of error should be reduced by the smaller geometries of forthcoming semiconductor devices. However, there is a current need for correction of converter nonlinearities and amplifier gain errors in high-speed, wide dynamic range A/D converters used in wideband digital processing of HF, VHF, and UHF radio signals. The desired A/D converters should have discrete distortion products which are 80 to 100 dB below full scale, noise densities that are 140 to 170 dB/Hz below full scale, and sampling rates of from 10 to 100 Ms/s. Because currently available A/D converters cannot meet these specifications, an improvement in the performance of subranging A/D converters has been sought through self-calibration for linearity correction.

SUMMARY OF THE INVENTION

The present invention comprises a subranging A/D converter that employs a self-calibration mode for linearity correction. In the normal run mode, a sample-and-hold circuit of the subranging converter receives an analog input signal. The sample-and-hold circuit provides an output to a residue operational amplifier and to an estimator A/D converter. The digital output of the estimator A/D converter is input to an estimator D/A converter. The analog output of the estimator D/A converter is provided to an inverting input of the residue operational amplifier where it is subtracted from the analog signal that is output by the sample-and-hold circuit. The analog output of the residue operational amplifier is provided to a residue A/D converter. The digital outputs of the estimator A/D converter and the residue A/D converter are combined and corrected to provide the digital output of the subranging converter system with a resolution greater than that provided by the first stage estimator A/D converter alone.

The primary cause of nonlinearity in subranging A/D converters is the nonlinearity of the estimator D/A converter. This source of nonlinearity can be corrected by storing a digital correction table that provides digital signals representing the true analog output voltage of the estimator D/A converter. The correction table must have at least as many bits of resolution as desired from the overall subranging A/D converter.

The present invention provides a means of constructing a calibration table for the estimator D/A converter by using the residue A/D converter to measure the size of each quantizing step of the estimator D/A converter. In the calibration mode, a switch disconnects the analog input signal and connects a line providing the analog output of the estimator D/A converter combined with a low-impedance noise signal from a dither circuit as the input to the sample-and-hold circuit. In addition, the estimator A/D converter is disconnected and an up-/down calibration counter is connected to provide an input to the estimator D/A converter.

When the subranging A/D converter of the present invention is switched to the calibration mode, calibration starts with an output from the calibration counter applied to the estimator D/A converter and to a calibration and correction logic circuit. The analog output of the estimator D/A converter is provided as an inverted input to the residue operational amplifier and is combined with the noise signal from the dither circuit for input to the sample-and-hold circuit. The analog output of the sample-and-hold circuit is provided as a noninverted input to the residue operational amplifier, the output of which is provided to the residue A/D converter. Since both inputs to the differential residue operational amplifier come from the estimator D/A converter, the residue amplifier output is nominally zero. The digital output of the residue A/D converter is provided to the calibration and correction logic circuit for storage, whereupon the up/down calibration counter is incremented or decremented one step. The output of the residue A/D converter is again measured and stored. The difference between the first and second residue A/D converter readings is a measure of one estimator D/A converter voltage step measured in terms of the residue A/D scale constant. Thus, the gain constant of the residue A/D converter need not be measured in order to achieve high linearity. This calibration procedure is repeated for each step of the estimator D/A converter until all steps have been calibrated for the full range of the estimator D/A converter. In addition, the calibration trials for each step are repeated many times by stepping the estimator D/A converter alternately up and down to average out any hysteresis. The overall calibration table is obtained by adding together all the stored step sizes for step numbers equal to or less than the table entry number to obtain an integral rather than a differential calibration table. Thus, the final size of each step that is calculated and stored in the calibration and correction logic circuit is the average of all measurements of each given step that did not overload the residue A/D converter.

When the overall calibration cycle has been completed and the linearity correction table has been stored in the calibration and correction logic circuit, the subranging converter is switched from the calibration mode to the run mode for receiving the analog input signal. Because the subranging converter of the present invention uses the residue amplifier and residue A/D converter to calibrate the estimator D/A converter, there is no need to make gain calibration corrections of the residue amplifier and A/D converter. In addition, the cost of the calibration hardware is minimized because the calibration mode utilizes the hardware already present in the subranging A/D converter. The use of a large number of step measurements during the calibration process, each measurement positioned in a different portion of the residue A/D converter, averages out the residue A/D converter quantizing errors. Furthermore, the use of both up and down incremental steps and averages also reduces the effects of hysteresis, random errors, and noise. Thus, the use of linearity correction tables stored in the calibration and correction logic circuit largely eliminates the effects of quantizing nonlinearities of the estimator D/A converter of the subranging A/D converter system.

BRIEF DESCRIPTION OF THE DRAWINGS

For a more complete understanding of the present invention and for further advantages thereof, reference is made to the following Description of the Preferred Embodiment taken in conjunction with the accompanying Drawings, in which.

DESCRIPTION OF THE PREFERRED EMBODIMENT

Figure 1:
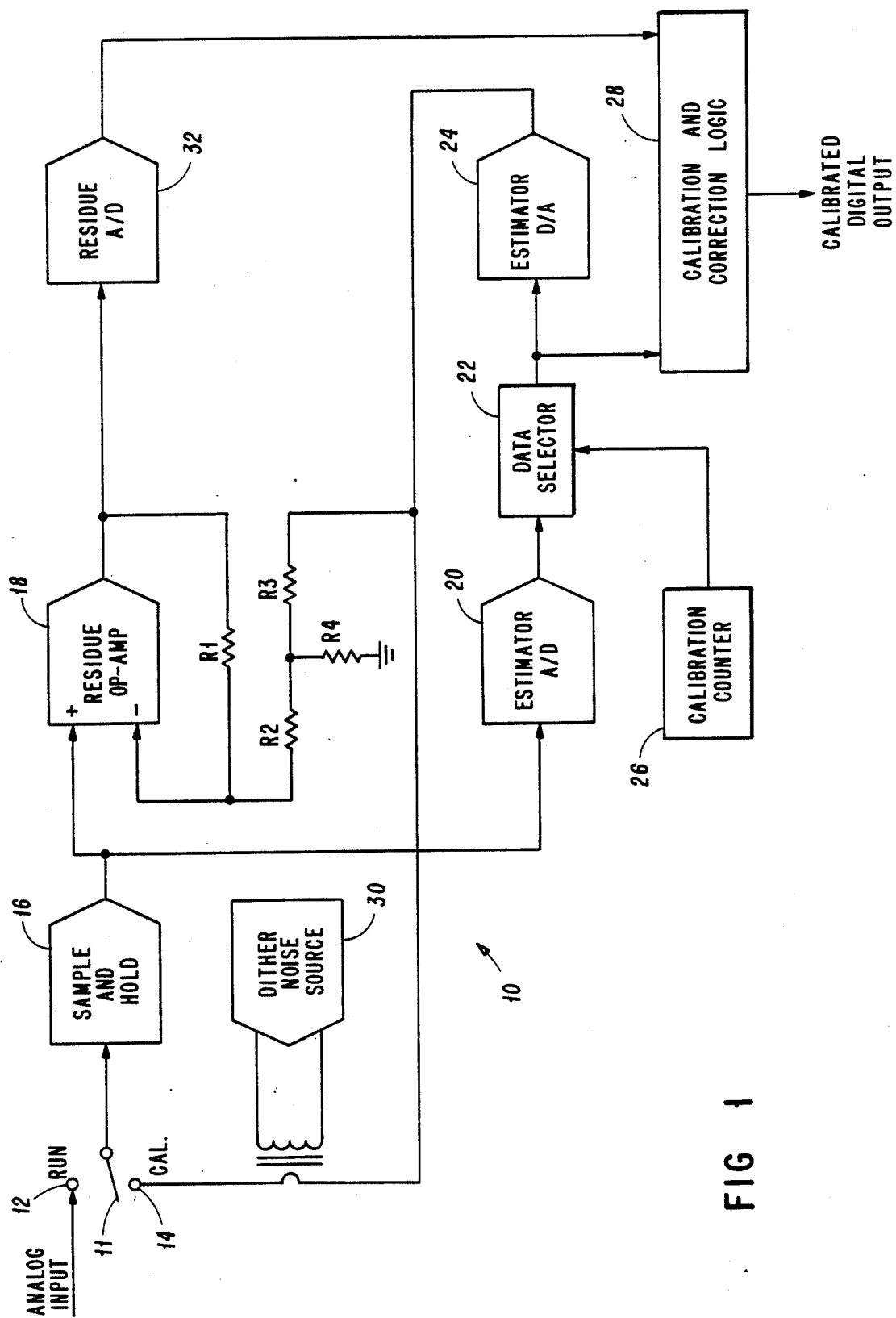
FIG. 1 is a block diagram of a subranging A/D converter of the present invention having a self-calibration mode for linearity correction.

A subranging analog-to-digital (A/D) converter 10 of the present invention is illustrated in block diagram form in FIG. 1. Converter 10 includes timing and control circuitry (not shown) as is well known in the art. Switch 11 provides a means for selecting a run mode or a calibration mode. In the run mode, an analog input signal at terminal 12 is provided to a sample-and-hold circuit 16. In the calibration mode, a calibration signal at terminal 14 is provided to the sample-and-hold circuit 16. Sample-and-hold circuit 16 provides an analog signal to a noninverting input of a residue operational amplifier 18 and to an estimator A/D converter 20. Estimator A/D converter 20 provides a digital output to data selector 22 which, in the run mode of converter 10, passes the signal to an estimator digital-to-analog (D/A) converter 24. The analog output of estimator D/A converter 24 is provided to an inverting input of the residue operational amplifier 18. The resistors R1, R2, R3, and R4 are selected to match the gain of the inverting and noninverting inputs of operational amplifier 18. The analog output of residue operational amplifier 18 is provided to residue A/D converter 32, which provides a digital input to calibration and correction logic circuit 28. A/D converters 20 and 32 may comprise TDC-1048 8-bit flash A/D converters manufactured by TRW, for example, and D/A converter 24 may comprise a TDC-1018 8-bit flash D/A converter.

In the run mode of operation of converter 10, the analog input signal is sampled and held for the duration of the conversion process. In the first stage of converter 10, the analog input voltage is measured by estimator A/D converter 20. The digital output of estimator A/D converter 20 drives the estimator D/A converter 24, the output of which is subtracted from the analog input signal by residue operational amplifier 18 so as to reduce the range of the analog residue signal. The analog residue signal is amplified by operational amplifier 18 so that the maximum voltage will drive residue A/D converter 32 to near full scale. The digital output of residue A/D converter 32, with the appropriate bit shift to account for the gain of operational amplifier 18, is combined with the output of estimator A/D converter 20 in the calibration and correction logic circuit 28. In the ideal case of perfect linearity and no gain errors, the resolution of the digital output of converter 10 is equal to the combined resolution of estimator A/D converter 20 and residue A/D converter 32. However, converters 20 and 24 are not perfect and the analog residue may exceed the range of residue A/D converter 32, leading to gross errors. Therefore, the range of residue A/D converter 32 should cover two to eight quantizing levels of estimator D/A converter 24.

Assuming that there is sufficient overlap between converters, errors in estimator A/D converter 20 do not effect the overall accuracy of converter 10. However, the analog output of estimator D/A converter 24 must accurately reflect the digital output of estimator A/D converter 20 because it is necessary for the calibration and correction logic circuit 28 to know digitally exactly how much analog voltage is being subtracted by operational amplifier 18 from the analog input signal. It has been shown by simulation that a major improvement in linearity can be achieved by correction of the estimator D/A converter 24, whereas little is achieved by correcting the linearity of the residue A/D converter 32. Thus, estimator D/A converter 24 should be calibrated to the actual gain constants of residue operational amplifier 18 and residue A/D converter 32. These corrections can be stored as a linearity correction table in calibration and correction logic circuit 28.

To change to the calibration mode of operation of converter 10, switch 11 is switched from terminal 12 to terminal 14. In the calibration mode, data selector 22 halts the output of estimator A/D converter 20 but passes the digital output of calibration counter 26, which is input to estimator D/A converter 24 and calibration and correction logic circuit 28. The analog output of estimator D/A converter 24, in addition to being provided to the inverting input of residue operational amplifier 18, is combined with a noise signal from dither noise source 30 and input through switch 11 to sample-and-hold circuit 16.

Figure 2:
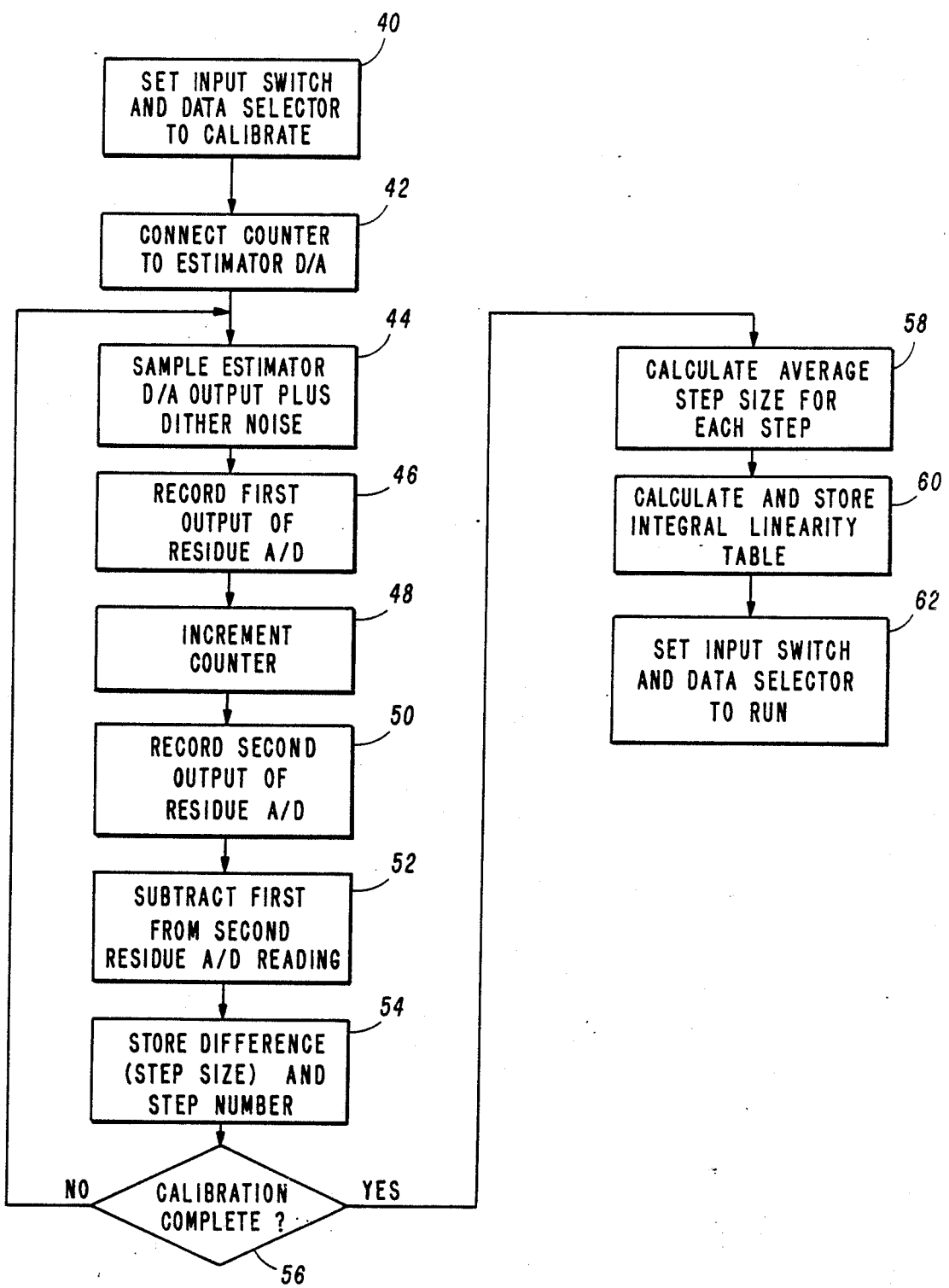
FIG. 2 is a flow diagram of the method of self-calibration for linearity correction of the subranging A/D converter illustrated in FIG. 1.

Operation of the calibration mode of converter 10 is shown in the simplified flow diagram of FIG. 2. As stated above, calibration of converter 10 is initiated when switch 11 and data selector 22 are switched to the calibration mode as indicated in block 40. In the calibration mode, the digital output of calibration counter 26 is applied to estimator D/A converter 24 and calibration and correction logic circuit 28, as indicated in block 42 and shown in FIG. 1. Sample-and-hold circuit 16 then samples the analog output of estimator D/A converter 24 combined with the noise from dither noise source 30 as indicated in block 44. Residue operational amplifier 18 receives the output of sample-and-hold circuit 16 at the noninverting input terminal and the analog output of estimator D/A converter 24 at the inverting input terminal. The output of operational amplifier 18 is provided to residue A/D converter 32, which provides a first digital input to calibration and correction logic circuit 28, as shown in block 46.

Normally, each quantizing step of estimator A/D converter 20 can be measured only to an accuracy of ½ quantizing step of the residue A/D converter 32. This results in an integral calibration table of rather poor accuracy since the integral table is obtained by adding many step measurements together. However, improved step size measurements are obtained by adding the small random noise or dither voltage to the input of the sample-and-hold circuit during calibration so that each time a step size measurement is repeated the residue A/D converter 32 input voltage is centered in a slightly different part of the residue A/D converter range. It has been demonstrated that improved resolution and accuracy can be obtained by averaging a large number of such step size measurements. Thus, by introducing dither into the sample-and-hold circuits input during the calibration, the voltage of each step of estimator D/A converter 20 can be measured to a resolution much smaller than the resolution of residue A/D converter 32. It is thus possible to construct a correction table which provides very low nonlinear distortion in the overall subranging A/D converter 10.

Noise from dither noise source 30 is added to the analog output of estimator D/A converter 24 so that the combined signal corresponding to a given step of calibration counter 26 will fall in a slightly different region of the range of residue A/D converter 32 each time calibration of that step is repeated. This will cause the quantizing error to be a random variable with a known rms error. The average of these quantized step sizes is a close approximation to the true step size with an rms error inversely proportional to the square root of the number of calibration trials.

After recording the first output of residue A/D converter 32, calibration counter 26 is incremented or decremented as shown in block 48. The second output of the residue A/D converter 32 is recorded as indicated in block 50. The first residue A/D converter reading taken in block 46 is then subtracted from the second residue A/D converter reading taken in block 50, as indicated in block 52. This difference is a measurement of the size of the present step and is stored along with the present step number as indicated in block 54. This calibration process is repeated many times by stepping calibration counter 26 both up and down, one step at a time, over the entire range of estimator D/A converter 24.

When a predetermined number of readings have been made of the size of each step of estimator D/A converter 24, the system exits the calibration loop as indicated in block 56. The average size of each step is then calculated by adding together all of the step size readings for each step and dividing by the number of readings for that step, as indicated in block 58. The integral linearity correction table is then calculated for each estimator D/A converter output level by adding together all of the average sizes of each step which contribute to that output level, as indicated in block 60. The calibration procedure is now complete and the input switch 11 and the data selector 22 are set to the run position as indicated in block 62.

During normal operation of subranging A/D converter 10 in the run mode, the linearity correction factors stored in calibration and correction logic 28 are applied to the digital signals generated by estimator A/D converter 20 and are added to the digital output of the residue A/D converter 32. After the appropriate correction has been applied, calibration and correction logic circuit 28 outputs a calibrated digital signal, as indicated in FIG. 1.

Although the present invention has been described with respect to a specific embodiment thereof, various changes and modifications may be suggested to one skilled in the art, and it is intended that the present invention encompass such changes and modifications as fall within the scope of the appended claims.

I claim:

1. Apparatus for calibrating a subranging analog-to-digital converter, comprising:
    means for providing an incrementable calibration signal to the means for incrementing said calibration signal in steps; and
    means for computing and storing a calibration table based on an average step size generated by the converter for each of said calibration signal steps.

2. The apparatus of claim 1, wherein said means for providing a calibration signal includes a means for switching the converter from a run mode to a calibration mode.

3. The apparatus of claim 2, wherein said means for providing said calibration signal further comprises means for adding a noise signal to said calibration signal.

4. The apparatus of claim 2, wherein said means for computing and storing comprises a calibration and correction logic circuit that calculates and stores said calibration table when in said calibration mode and that provides a corrected digital output corresponding to an analog input to the converter in said run mode.

5. The apparatus of claim 1, wherein said means for incrementing said calibration signal includes means for stepping said calibration signal both up and down in a calibration cycle comprising a multiplicity of calibration trials for each of said calibration signal steps.

6. Self-calibration apparatus for a subranging analog-to-digital (A/D) converter having an estimator A/D converter and a residue A/D converter, comprising:
    means for switching between a run mode and a calibration mode, said switching means providing an analog input to a residue operational amplifier and to the estimator A/D converter;
    a calibration counter for generating digital calibration signals in incremental steps;
    a data selector for selectively transferring, to an estimator digital-to-analog (D/A) converter and a calibration logic circuit, an output of the estimator A/D converter in said run mode and said calibration signal in said calibration mode;
    said residue operational amplifier receiving a signal from said estimator D/A converter as a second analog input;

the residue A/D converter receiving an output from said residue operational amplifier and providing an input to said calibration logic circuit; said calibration logic circuit computing and storing a calibration table of correction factors for each of said calibration signal steps in said calibration mode and providing a corrected digital output in said run mode.

7. The apparatus of claim 6, further comprising means for stepping said calibration signal both up and down in a calibration cycle comprising a multiplicity of calibration trials for each of said calibration signal steps.

8. The apparatus of claim 6, further comprising a dither circuit for adding a noise signal to the output of said estimator D/A converter to provide an input to said switching means in said calibration mode.

9. A method of calibrating a subranging analog-to-digital converter, comprising the steps of:
  providing an incrementable calibration signal to the converter;
  incrementing said calibration signal in digital steps; and
  computing and storing a step size generated by the converter for each of said calibration signal steps.

10. The method of claim 9, wherein the step of incrementing said calibration signal includes stepping said calibration signal both up and down in a calibration cycle comprising a multiplicity of calibration trials for each of said calibration steps.

11. The method of claim 9, wherein the step of providing a calibration signal to the converter further comprises the steps of: converting said calibration signal to an analog signal; and adding a noise signal to said analog signal before the step of computing and storing said step size.

12. The method of claim 9, further comprising the steps of:
  storing a calibration table of correction factors derived from said step sizes;
  switching the converter to a run mode for receiving an analog generating a digital signal corresponding to said analog input; and
  applying said correction factors to said digital signal to produce a corrected digital output.

* * * * *